(12) United States Patent
Hwang

(10) Patent No.: US 7,672,162 B2
(45) Date of Patent: Mar. 2, 2010

(54) NON-VOLATILE MEMORY DEVICE, MEMORY SYSTEM, AND LSB READ METHOD

(75) Inventor: Sang-won Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 12/103,176

(22) Filed: Apr. 15, 2008

(65) Prior Publication Data

US 2008/0259686 A1 Oct. 23, 2008

(30) Foreign Application Priority Data

Apr. 19, 2007 (KR) ............... 10-2007-0038414

(51) Int. Cl.
*G11C 16/04* (2006.01)
(52) U.S. Cl. ............... 365/185.03; 365/185.09
(58) Field of Classification Search ............ 365/185.03, 365/185.2, 185.22, 185.09, 185.21, 189.07
See application file for complete search history.

(56) References Cited

U.S. PATENT DOCUMENTS

| 6,315,200 | B1 * | 11/2001 | Silverbrook et al. | 235/454 |
| 7,234,645 | B2 * | 6/2007 | Silverbrook et al. | 235/494 |
| 2005/0180209 | A1 | 8/2005 | Lasser | |
| 2005/0180211 | A1 * | 8/2005 | Guterman et al. | 365/185.03 |
| 2009/0113121 | A1 * | 4/2009 | Lee et al. | 711/103 |

FOREIGN PATENT DOCUMENTS

| JP | 2004192789 | 7/2004 |
| JP | 2004192789 A | 7/2004 |
| JP | 2004355793 | 12/2004 |
| KR | 100205006 B1 | 3/1999 |
| KR | 100459946 B1 | 11/2004 |
| KR | 100684909 B1 | 2/2007 |
| KR | 100769770 B1 | 10/2007 |

\* cited by examiner

*Primary Examiner*—Gene N. Auduong
(74) *Attorney, Agent, or Firm*—Volentine & Whitt, PLLC

(57) ABSTRACT

A non-volatile memory device and system as well as a LSB read method are disclosed. The LSB read method includes reading LSB data from a memory cell during a main LSB read operation making reference to a flag cell threshold voltage, determining whether the LSB data contains an error, and if the LSB data contains an error re-reading the LSB data during a LSB recover-read operation without making reference to the flag cell threshold voltage.

20 Claims, 10 Drawing Sheets

NON-VOLATILE MEMORY DEVICE, MEMORY SYSTEM, AND LSB READ METHOD

CROSS-REFERENCE TO RELATED APPLICATIONS

This U.S. non-provisional patent application claims priority under 35 U.S.C. § 119 to Korean Patent Application No. 10-2007-0038414 filed on Apr. 19, 2007, the subject matter of which is hereby incorporated by reference.

BACKGROUND OF THE INVENTION

The present invention relates to a non-volatile semiconductor memory device. More particularly, the invention relates to a Least Significant Bit (LSB) read method for a non-volatile memory device and a memory system including same.

The use of data storage devices such as volatile memories and nonvolatile memories has greatly expanded in applications related to mobile devices such as MP3 players, PMPs, mobile phones, notebook computers, PDAs, and the like. These mobile devices increasingly demand large data storage capabilities in order to provide high-end functionality, such as video recording, editing and playback. In order to satisfy these demands, multi-bit memory devices have been developed which are capable of storing N-bit data per memory cell, wherein N is 3 or more.

Exemplary multi-bit memory devices are disclosed, for example, in U.S. Pat. Nos. 6,122,188; 6,075,734; and 5,923,589, the collective subject matter of which is hereby incorporated by reference.

In a case where 1-bit data is stored in each memory cell of a memory cell array, each properly programmed memory cell will have a threshold voltage within one of two (2) defined threshold voltage distributions. That is, a memory cell will have one of two possible data states corresponding respectively to data values of '1' or '0'. In contrast, in a case where 2-bit data is stored in each memory cell, each properly programmed memory cell will have a threshold voltage within one of four (4) defined threshold voltage distributions. That is, a memory cell will have one of four possible states respectively corresponding to data values of '11', '10', '01' and '00'.

When the threshold voltage of a memory cell is increased to a threshold voltage above the so-called erased state (or, the ON state), the memory cell is said to be "programmed". Figure (FIG.) 1 is a diagram describing a programming method for a NAND flash memory device comprising two-bit memory cells. Referring to FIG. 1, the two-bit memory cell is programmed using a LSB program operation and a Most Significant Bit (MSB) program operation. That is, the NAND flash memory device programs 2-bit data using a MSB program operation that follows a LSB program operation.

Accordingly and as illustrated in FIG. 1, the two-bit memory cell may reside at any given time in one of three possible programming states; (a) an erased state, (b) a LSB-programmed state, and (c) a MSB-programmed state. One exemplary procedure for programming the two-bit memory cell will now be described.

A case is assumed wherein a data value of '10' is programmed to a 2-bit memory cell currently residing in an erased state. Thus, the '0' value is the LSB of data and the '1' value is the MSB of data. Following execution of the LSB program operation, the memory cell will have a threshold voltage that corresponds to either the '11' data or the '10' data. Then, the MSB program operation is carried out, and the threshold voltage of the memory cell will migrate (a) from a threshold voltage corresponding to '11' data to either '11' data or '01' data, or (b) from a threshold voltage corresponding to '10' data to either '00' data or '10' data.

Within this overall programming procedure, the threshold voltage of a flag cell may be used to determine whether a selected page of memory cells has been properly MSB programmed. That is, based upon a threshold voltage position of the flag cell, a selected page may be judged to be either LSB programmed or MSB programmed.

A NAND flash memory device may perform an LSB program operation or an MSB program operation in response to a read command and an address that are externally provided (e.g., from a memory controller). In general, a received page address may be identified as a LSB page address and a MSB page address. Accordingly, a NAND flash memory device may determine whether the LSB program operation or the MSB program operation should be performed based on a read command and the received address. An exemplary LSB read operation and MSB read operation will be described in some additional detail with reference to FIGS. 2 and 3.

FIG. 2 is a flowchart summarizing an LSB read operation operative within a NAND flash memory device comprising two-bit memory cells. The LSB read operation begins when the NAND flash memory device determines that a read operation indicated by an input read command is an LSB read operation. This determination may be made according to the received input address. If the read operation indicated by the input read command is an LSB read operation, the NAND flash memory device may read data from the memory cells of a selected page in relation to a second read voltage R2 (S111). The selected page is assumed to include a flag cell used to indicate whether the selected page is LSB programmed or MSB programmed.

Thus, a determination is made as to whether the threshold voltage of the flag cell is higher than the second read voltage R2 (S112). A flag cell threshold voltage less than the second read voltage R2 indicates that the memory cell is LSB programmed. A flag cell threshold voltage greater than the second read voltage R2 indicates that the memory cell is MSB programmed.

If the flag cell threshold voltage is less than the second read voltage R2 (S112=no), the NAND flash memory device reads data from the memory cells of the selected page using a first read voltage R1 (S113). That is, if the selected page is LSB programmed, the NAND flash memory device may again read data from memory cells of the selected page using the first read voltage R1.

A determination is now made as to whether the threshold voltage of the memory cells in the selected page are greater than the first read voltage R1 (S114). In other words, the NAND flash memory device determines the value of LSB data for each memory cell in the selected page based upon whether its threshold voltage is greater than the first read voltage R1. If the threshold voltage of respective memory cells in the selected page is greater than the first read voltage R1, then a LSB data value of '0" is indicated (S117). If the threshold voltage of respective memory cells in the selected page is less than the first read voltage R1, then a LSB data value of '1" is indicated (S116).

However, if the flag cell threshold voltage is greater than the second read voltage R2 (S112=yes), a determination is made as to whether the threshold voltage of each memory cell in the selected page is greater than the second read voltage R2 (S115). That is, if the selected page is determined to be MSB programmed, the LSB data of each memory cell may be determined based on whether the threshold voltage of each memory cell in the selected page is greater than the second read voltage R2.

As understood from the above description, if the threshold voltage of respective memory cells in the selected page is less than the second read voltage R2 (S115=no), an LSB data value of '1' is indicated (S116). If the threshold voltage of respective memory cells in the selected page is greater than the second read voltage R2 (S115=yes), an LSB data value of '0' is indicated (S117).

FIG. 3 is a flowchart summarizing an MSB read operation for a NAND flash memory device comprising two-bit memory cells. The MSB read operation begins when the NAND flash memory device determines that a read operation indicated by an input read command is an MSB read operation. This determination may be made according to the received input address. If the read operation indicated by the input read command is an MSB read operation, the NAND flash memory device may read data from the memory cells of a selected page in relation to the first read voltage R1 (S211). The selected page is again assumed to include a flag cell used to indicate whether the selected page is LSB programmed or MSB programmed.

The NAND flash memory device determines whether the flag cell threshold voltage is less than the first read voltage R1 (S212). If the selected page is determined to be MSB programmed, the flag cell threshold voltage will be greater than the first read voltage R1.

If the flag cell threshold voltage is greater than the first read voltage R1 (S212=no), the NAND flash memory device nest determines whether the threshold voltage of each memory cell in the selected page is less than the first read voltage R1 (S213).

If the threshold voltage of each memory cell in the selected page is greater than the first read voltage R1 (S213=no), the data stored in the memory cells of the selected page may be again read using a third read voltage R3 (S214).

After the stored data is read from the memory cells of the selected page, a determination is made as to whether the threshold voltage of each memory cell in the selected page is greater than the third read voltage R3 (S215). If the threshold voltage of each memory cell in the selected page is less than the third read voltage R3 (S216=no), the MSB data for each memory cell is determined to be data '0'. On the other hand, if the flag cell threshold voltage is greater than the first read voltage R1 (S212=yes), or if the threshold voltage of each memory cell is less than the first read voltage R1 (S213=no), or if the threshold voltage of each memory cell is greater than the third read voltage R3 (S215=no), then the MSB data is determined to be data '1' (S217).

As illustrated in FIG. 1, the conventional flag cell may be maintained in the erase state (i.e., data '11') during the LSB program operation, but may then be programmed into data '10' during the MSB program operation. However, the flag cell may suffer from voltage variations due to a number of reasons including, for example, read voltage stress, write voltage stress, coupling, power-off effects, etc. In such cases, the flag cell may not properly retain a desired data state during one or both of the LSB and MSB program operations. This may cause a data error when data is read from a selected page programmed in relation to errant flag cell voltage.

FIG. 4 further illustrates a case wherein a flag cell voltage is disturbed during a LSB program operation. Referring to FIG. 4, the threshold voltage of the flag cell is intended to indicate data '10'. However, due to some external effect, the flag cell threshold voltage becomes greater than the second read voltage R2. As a result, during a LSB read operation a memory cell having a threshold voltage between the first and second read voltages R1 and R2 may be erroneously read from the memory cells in the selected page. That is, assuming that normal LSB data for a memory cell is '0', the LSB data for the memory cell may be read as '1' due to a disturbed flag cell threshold voltage.

Additionally, if a power is turned OFF during the MSB program operation of a NAND flash memory device, there may be damaged data in the MSB page, as well as data in the LSB page sharing the same word line as the MSB page. This result usually occurs when a power is turned OFF while the flag cell is being programmed to a data '10' state from a data '11' state.

FIG. 5 further illustrates a case wherein a flag cell is disturbed when power is turned OFF during a MSB program operation. Referring to FIG. 5, it is assumed that the flag cell has a threshold voltage between the second read voltage R2 and the third read voltage R3 corresponding to a data state of 'X0'. In this case, data in a memory cell may be erroneously read during a subsequently applied LSB read operation. That is, normal LSB data of a memory cell is '0'. But, during the subsequent LSB read operation, the LSB data of the memory cell may be read as '1' due to the disturbed flag cell.

FIG. 6 further illustrates a case wherein a flag cell is disturbed when a power is turned OFF during a MSB program operation. Referring to FIG. 6, it is assumed that a threshold voltage of a flag cell resides within a threshold voltage distribution corresponding to a data '10' state. In this case, data in a memory cell may be erroneously read out during a subsequently applied LSB read operation. That is, normal LSB data of the memory cell is '0', but the LSB data of the memory cell may be read as '1' due to the disturbed flag cell.

As described above in multiple cases, a conventional NAND flash memory device may erroneously read LSB data due to a disturbed flag cell. Further, it is often impossible to recover erroneously read LSB data via conventional LSB read methods.

SUMMARY OF THE INVENTION

Embodiments of the invention provide an LSB read method operative within a non-volatile memory device and memory system that is capable of recovering erroneously read LSB data.

In one embodiment, the invention provides a Least Significant Bit (LSB) read method for a non-volatile memory device comprising multi-level memory cells, the method comprising; reading LSB data from a memory cell during a main LSB read operation making reference to a flag cell threshold voltage, determining whether the LSB data contains an error, and if the LSB data contains an error re-reading the LSB data during a LSB recover-read operation without making reference to the flag cell threshold voltage.

In another embodiment, the invention provides a non-volatile memory device comprising; a memory core comprising a memory cell capable of being programmed by a LSB program operation and a MSB program operation, a read state machine configured to control the memory core to perform the LSB read operation or the MSB read operation in relation to an externally applied input read command and corresponding address and with reference to a flag cell threshold voltage, an error detect module configured to detect whether LSB data read from the memory cell during a main LSB read operation contain an error and generating an error signal upon detecting the error, and an LSB recover-read state machine responsive to the error signal and configured to control the memory core to perform a LSB recover-read operation operating without reference to the flag cell threshold voltage.

In another embodiment, the invention provides a memory system comprising; a non-volatile memory device controlled by a memory controller, wherein the non-volatile memory device comprises a memory core comprising a memory cell capable of being programmed by a LSB program operation and a MSB program operation, and the operative combination of the non-volatile memory device and the memory controller implement a read state machine configured to control the memory core to perform the LSB read operation or the MSB read operation in relation to an externally applied input read command and corresponding address and with reference to a flag cell threshold voltage, an error detect module configured to detect whether LSB data read from the memory cell during a main LSB read operation contain an error and generating an error signal upon detecting the error, and an LSB recover-read state machine responsive to the error signal and configured to control the memory core to perform a LSB recover-read operation operating without reference to the flag cell threshold voltage.

DESCRIPTION OF EMBODIMENTS

Figure 1:
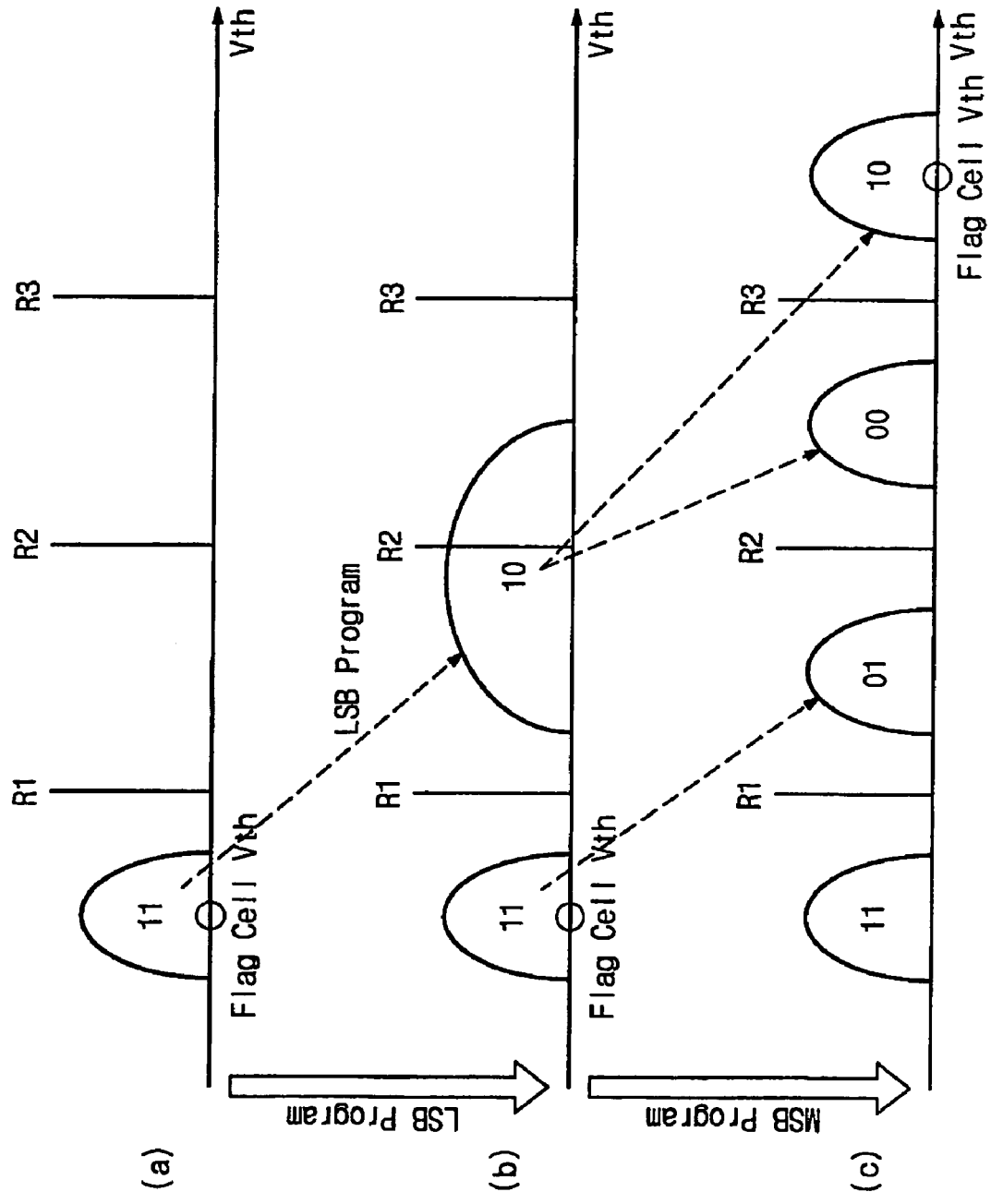
FIG. 1 is a diagram illustrating a program method for a NAND flash memory device comprising two-bit memory cells.

Embodiments of the invention will now be described with reference to the accompanying drawings. The present invention may, however, be embodied in different forms and should not be constructed as being limited to only the illustrated embodiments. Rather, these embodiments are presented as teaching examples. Throughout the written description and drawings, like reference numerals are used to indicate like or similar elements.

In accordance with the present invention, a multi-bit non-volatile memory device and memory system including same are operated according to a data programming procedure that includes at least one LSB read operation. In one embodiment of the invention, the LSB read operation includes a main LSB read operation which is typically performed during all programming operations and an LSB recover-read operation which is used only as needed when an error arises in the LSB data read during a main LSB read operation. In certain embodiments of the invention, the LSB recover-read operation may read LSB data from memory cells in a different manner from the main LSB read operation.

As one such embodiment, the main LSB read operation reads LSB data from memory cells in relation to a flag cell, while the LSB recover-read operation reads LSB data from memory cells without reference to the flag cell. As conventionally understood, the flag cell may be used to indicate whether a memory cell has been LSB programmed or MSB programmed.

In accordance with certain embodiments of the invention, although a read operation may fail with respect to LSB data stored in memory cells, a recover-read operation may nonetheless be carried out. In this regard, when a flag cell is used in relation to the main LSB read operation, embodiments of the invention may overcome such errors as conventionally occur when reading LSB data in relation to a disturbed flag cell voltage.

Figure 7:
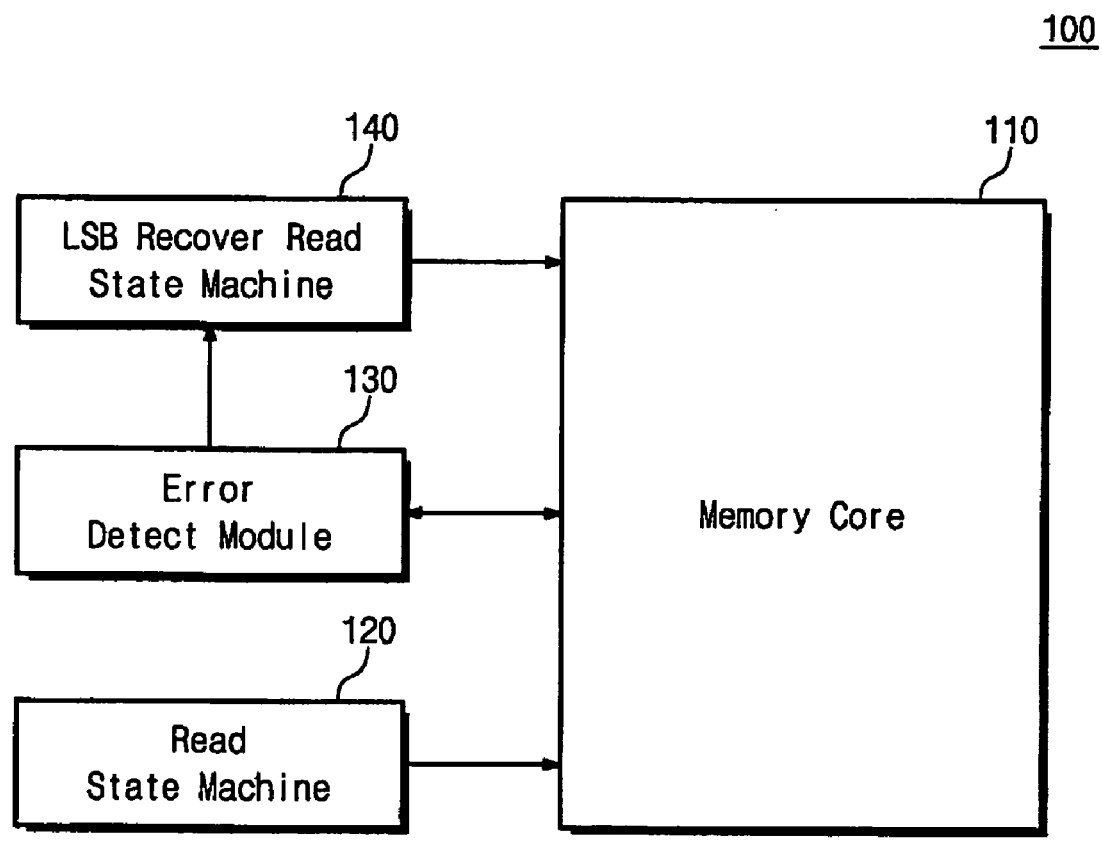
FIG. 7 is a block diagram showing a non-volatile memory device according to an embodiment of the invention.

FIG. 7 generally illustrates a non-volatile memory device according to an embodiment of the invention. Referring to FIG. 7, a non-volatile memory device 100 comprises a memory core 110, a read state machine 120, an error detect module 130, and an LSB recover-read state machine. Non-volatile memory device 100 is assumed to perform an LSB recover-read operation via the LSB recover-read state machine when an error in LSB data is detected by error detect module 130 during an LSB read operation.

Although not illustrated in FIG. 7, memory core 110 comprises an array of conventional multi-bit memory cells and related circuits, such as those commonly provided to program and/or read data from the array of memory cells in response to applied control signals. This collection of control signals may include control signals provided by a conventional program state machine (not shown), as well as read state machine 120, and LSB recover-read state machine 140. For example, the program state machine is assumed to provide such control signals as are commonly used to program data into memory core 110 and interface with an external memory controller. In conjunction with the program state machine, read state machine 130 provides control signals required to perform a read operation, and LSB recover-read state machine 140 provides control signals required to perform the LSB recover-read operation.

For convenience of description, it is assumed that the memory core 110 is a NAND flash memory core comprising 2-bit memory cells. However, it will be apparent to those skilled in the art that memory core 110 may implemented with other than NAND type memory cell and/or with memory cells capable of storing 3 or more data bits per memory cell. Memory core 110 is further assumed to be conventionally configured with a page buffer (not shown) that may be used to read/program data from/to the memory cells on a page unit basis. Thus, each of memory cells may have any one of an erase state, a LSB-programmed state, or a MSB-programmed state. Memory core 110 is further assumed to include flag cells indicating whether each page of memory cells is LSB programmed or MSB programmed.

In the illustrated example, read state machine 120 controls a read operation directed to data stored in memory core 110 in response to an externally provided read command and address (e.g., provided from a memory controller). In particular, read state machine 120 will determine whether a LSB or MSB read operation has been performed with respect to a page of memory cells selected according to the input read command and address. Based upon this determination result, read state machine 120 will generate the necessary control signals to accomplish the read operation. Memory core 110 will be accessed using the LSB or MSB read operations in relation to the control signals generated by read state machine 120. Hereinafter, a LSB read operation performed under the control of read state machine 120 will be referred to as a main LSB read operation.

Figure 2:
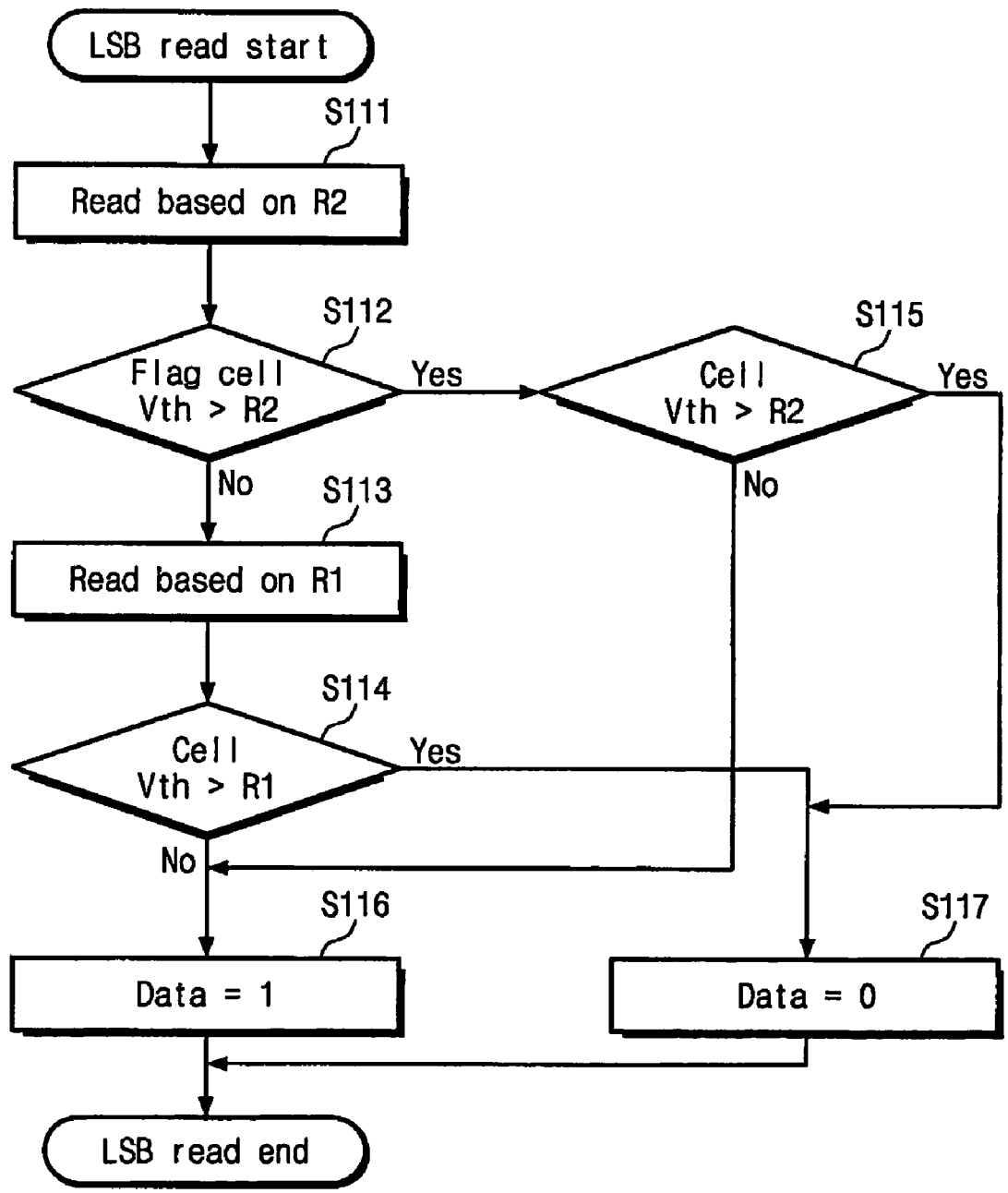
FIG. 2 is a flowchart summarizing a LSB read operation for a NAND flash memory device comprising two-bit memory cells.
Figure 3:
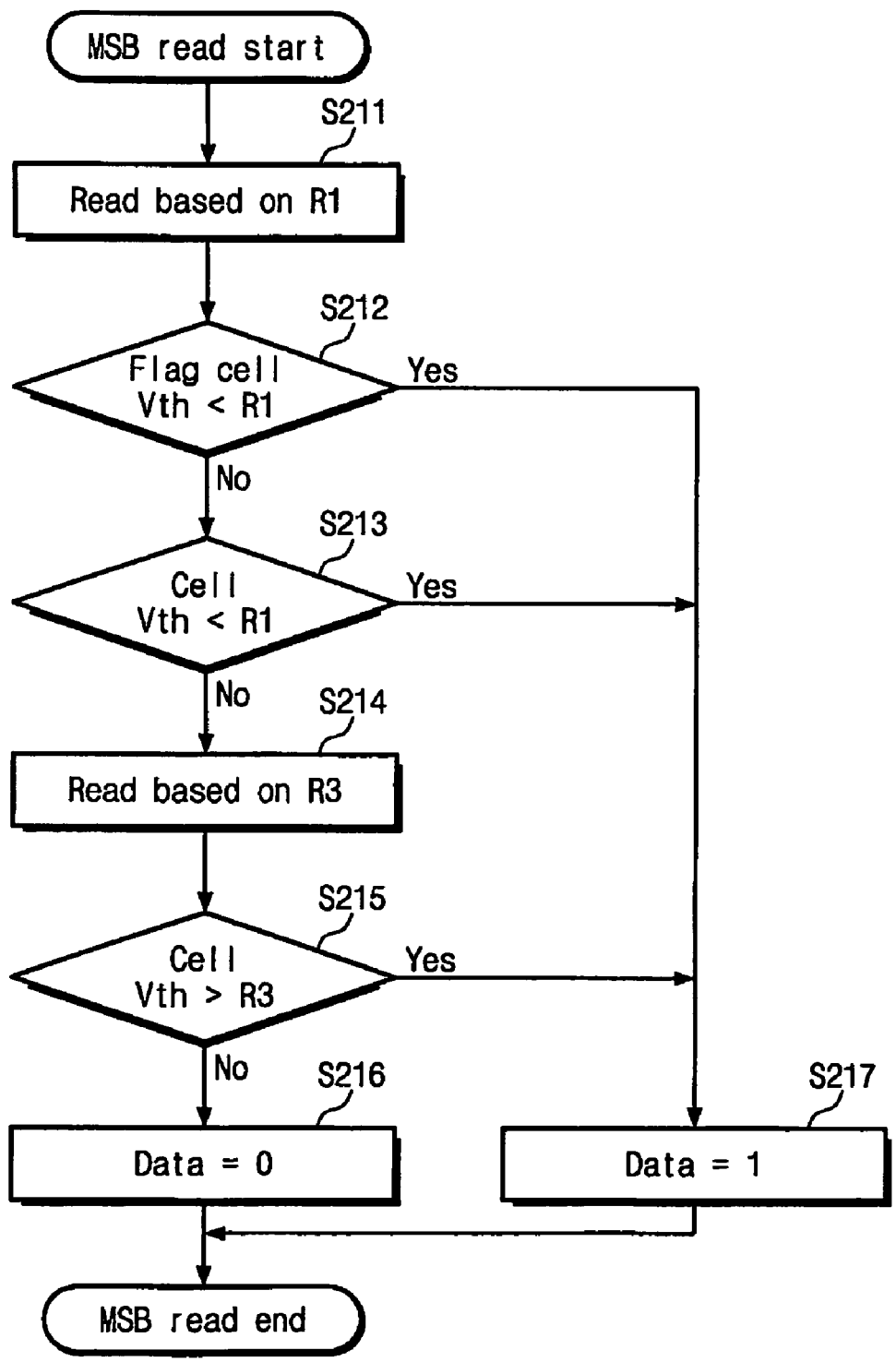
FIG. 3 is a flowchart summarizing a MSB read operation for a NAND flash memory device comprising two-bit memory cells.

For example, read state machine 120 may control memory core 110 in a manner to perform a conventional main LSB read operation and/or MSB operation, similar to the ones described in relation to FIGS. 2 and 3 above.

Error detect module 130 is used to detect whether an error is apparent in the data read from memory cells by a main read operation. Further, in embodiments of the invention, it may be possible to correct an error detected by error detect module 130. However, in cases where the detected error can not be recovered, error detect module 130 may send an error signal to LSB recover-read state machine 140.

Error detect module 130 may be implemented using conventionally understood Error Correction Cord (ECC), Cyclic Redundancy Check (CRC), Error-Detecting Codes (EDC) circuitry and associated software, or a similar error correction scheme. For example, ECC circuitry may be realized in relation to various conventionally understood error correction codes, such as Hamming codes, BCH codes, Read-Solomon codes, and the like.

ECC circuit using Hamming codes may detect a 2-bit error and correct a 1-bit error. That is, ECC circuit using Hamming codes may detect and correct a 1-bit error while it may detect up to a 2-bit error. On the other hand, CRC circuitry may be implemented which is capable of detecting up to an M-bit error, where M is 3 or more.

LSB recover-read state machine 140 operates in response to an error signal provided by error detect module 130 and controls memory core 110 in order to perform an LSB recover-read operation with respect to memory cells storing errant data. At noted above, the LSB recover-read operation may differ in its execution relative to the main LSB read operation which is controlled by read state machine 120. That is, the LSB recover-read operation may read LSB data from memory cells using a different reference as compared with the main LSB read operation.

Accordingly, non-volatile memory device 100 according to an embodiment of the invention is able to implement functionality that recovers LSB data if an error arises during LSB data read operation. For example, where LSB data is read using a flag cell during a main LSB read operation, a corresponding LSB recover-read operation will read the LSB data without recourse to the flag cell. Thus, during the LSB recover-read operation, data may be read from a memory cell regardless of the threshold voltage of a flag cell (errant or otherwise). In conventional non-volatile memory devices, if the flag cell threshold voltage is disturbed for some reason, data may be erroneously read during the main LSB read operation causing read data failure. But a non-volatile memory device according to an embodiment of the invention is able through the LSB recover-read operation to recover LSB data.

Figure 8:
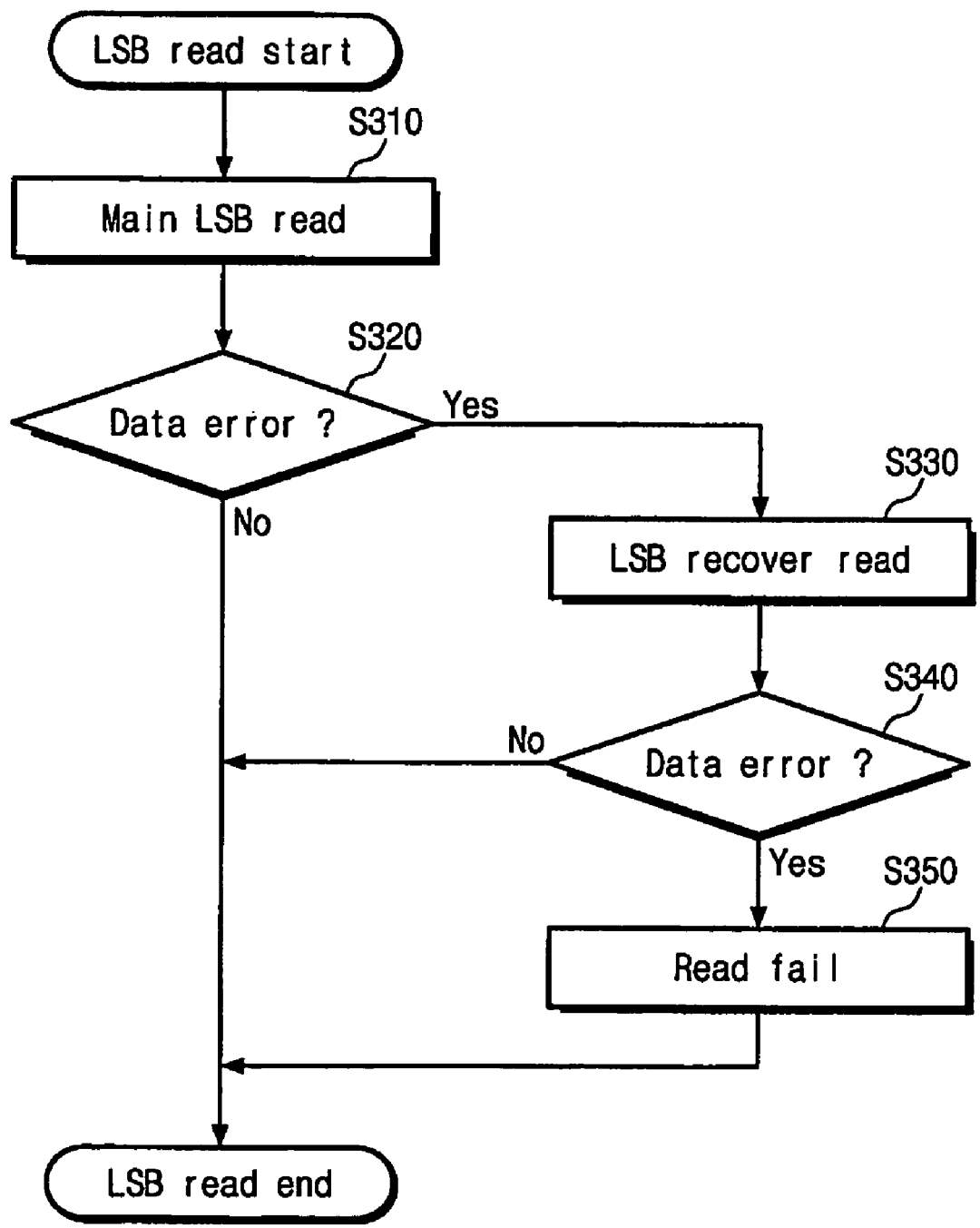
FIG. 8 is a flowchart summarizing a LSB read method for a non-volatile memory device according to an embodiment of the invention.

FIG. 8 is a flowchart summarizing an exemplary LSB read method for a non-volatile memory device according to an embodiment of the invention. Referring to FIGS. 7 and 8, the LSB read operation begins upon receipt of a read command and an address provided from an external device, such as a memory controller or a host processor.

Once the LSB read operation commences, read state machine 120 controls memory core 110 to perform a main LSB read operation in accordance with the read command and address (S310). In the illustrated embodiment, it is assumed that the main LSB read operation is similar to the conventional LSB read operation described above in relation to FIGS. 1 through 6. For example, if non-volatile memory device 100 is a NAND flash memory device comprising two-bit memory cells, the main LSB read operation may be similar to the LSB read operation set forth in relation to FIG. 2.

Following the main read operation, error detect module 130 detects whether the data read during the main LSB read operation contains one or more errors (S320). Error detect module 130 may be used to correct any identified errors, if they are correctable. If not correctable, error detect module 130 will communicate an error signal to LSB recover-read state machine 140. In a case wherein no error is identified, the LSB read operation may be ended.

However, if the data read during the main LSB read operation contains one or more errors (S320=yes), the LSB recover-read state machine 140 begins operation in response to an error signal and controls memory core 110 to implement the LSB recover-read operation (S330).

Assuming that the main LSB read operation is performed in relation to a flag cell threshold voltage, the LSB recover-read operation need not make reference to the flag cell. Hence, if the flag cell threshold voltage is disturbed, it is yet possible to recover LSB data in the memory cells using the LSB recover-read operation. This will be more fully described with reference to FIG. 9.

Following the LSB recover-read operation, error detect module 140 again determines whether the LSB data read contain one or more data errors (S340). If a data error is identified (S340=yes), the LSB read operation is ended and the resulting read fail indication is made (S350).

Figure 9:
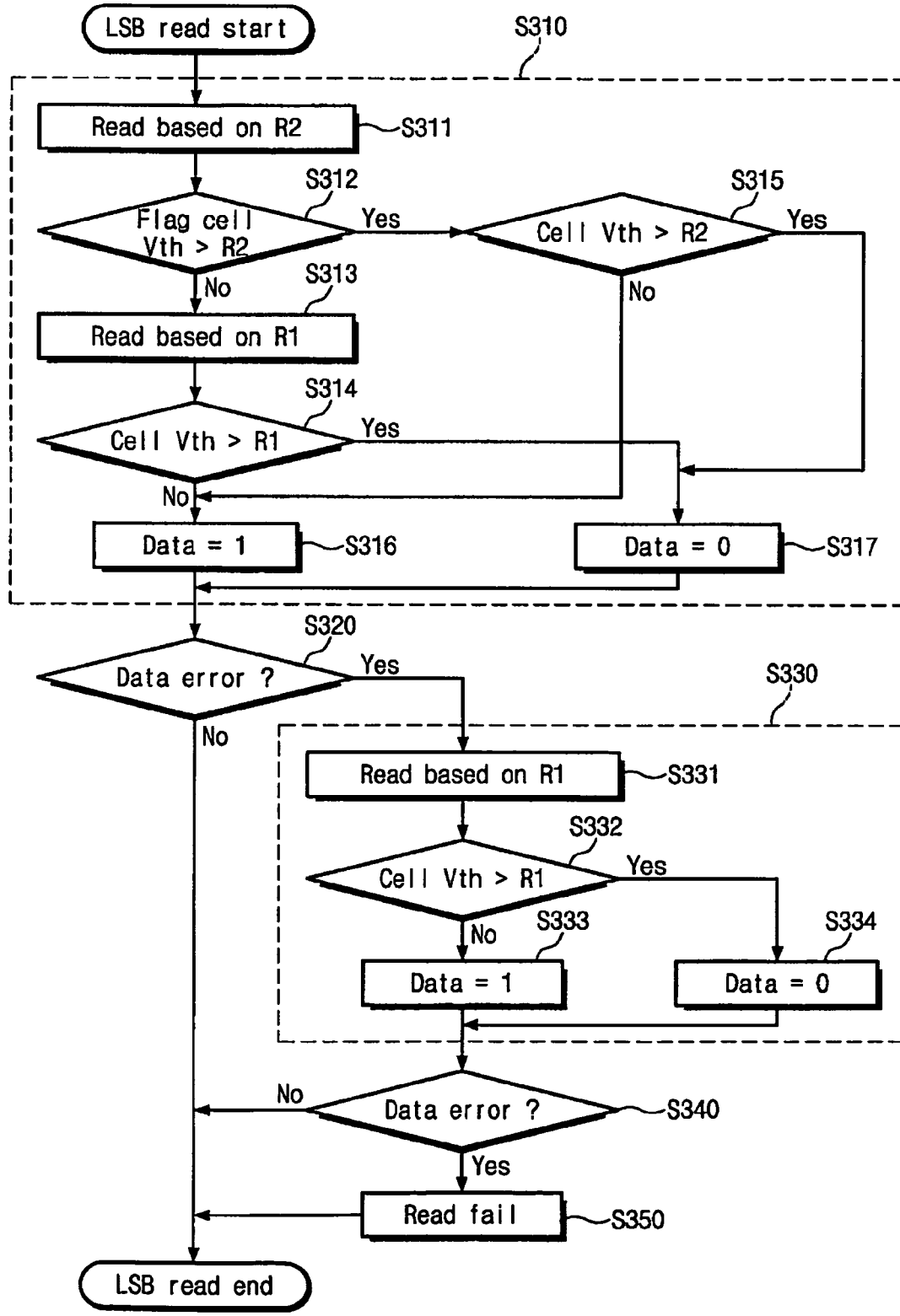
FIG. 9 is a flowchart further describing the LSB recover-read operation described in relation to FIG. 8.

FIG. 9 is a flowchart summarizing an exemplary LSB recover-read operation such as one that might be used in the method illustrated in FIG. 8. Prior to the LSB recover-read operation, the main LSB read operation is performed (S310). (See, description provided above in relation to FIG. 2 where the three hundred series method steps S311 through S317 indicated in FIG. 9 are respectively analogous to the one hundred series method steps S11 through S317).

An exemplary LSB recover-read operation (S330) will now be described in some additional detail with reference to FIGS. 1, 2, and 7-9.

LSB recover-read state machine 140 responds to an error signal from error detect module 130 to control memory core 110 in order to read the data stored in the memory cells of a selected page using the first read voltage R1 as a word line voltage (S331).

A determination is made as to whether the threshold voltage of each memory cell in the selected page is greater than the first read voltage R1 (S332). If the threshold voltage of a memory cell in the selected page is less than the first read voltage R1 (S332=no), the stored data in the respective memory cell is identified as a data value of '1' (S333). Otherwise (S332=yes), the stored data in the respective memory cell is identified as a data value of '0' (S334). Once this determination has been made, the LSB recover-read operation is essentially completed and the method returns to that flowchart previously described in relation to FIG. 8. As set forth above, after the LSB recover-read operation is completed, and as illustrated in FIGS. 8 and 9, a determination is made as to whether one or more errors is apparent in the read during the LSB recover-read operation (S340).

Hereinafter, there will be described how LSB read error is prevented via the LSB read method of an embodiment of the invention.

Figure 4:
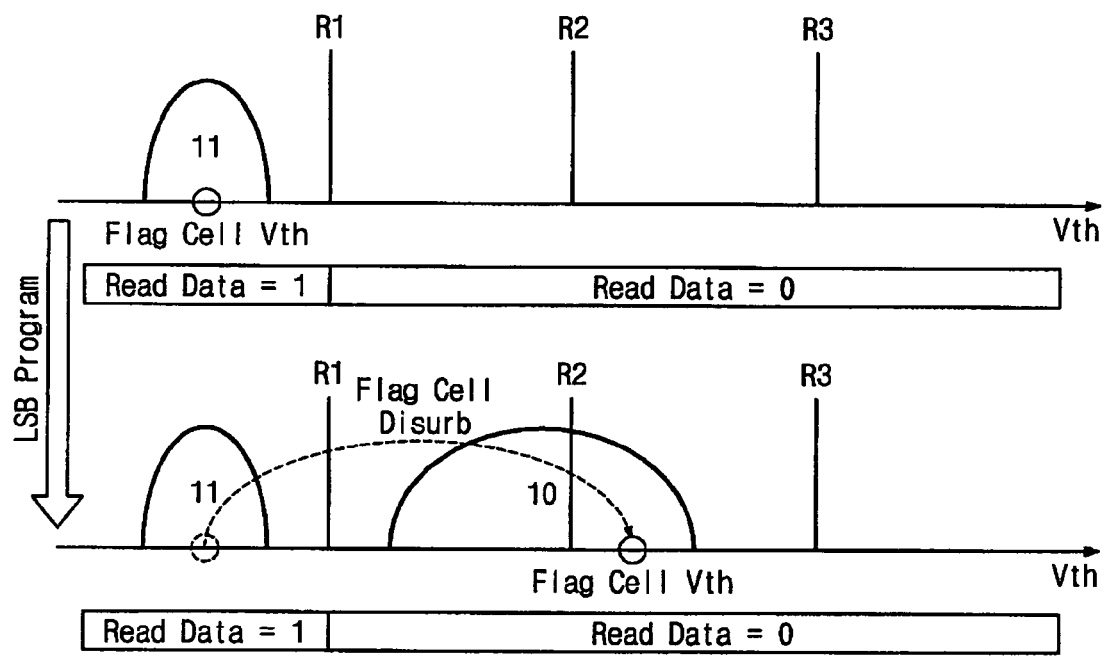
FIG. 4 illustrates a case wherein a flag cell is disturbed in relation to a LSB program operation.
Figure 5:
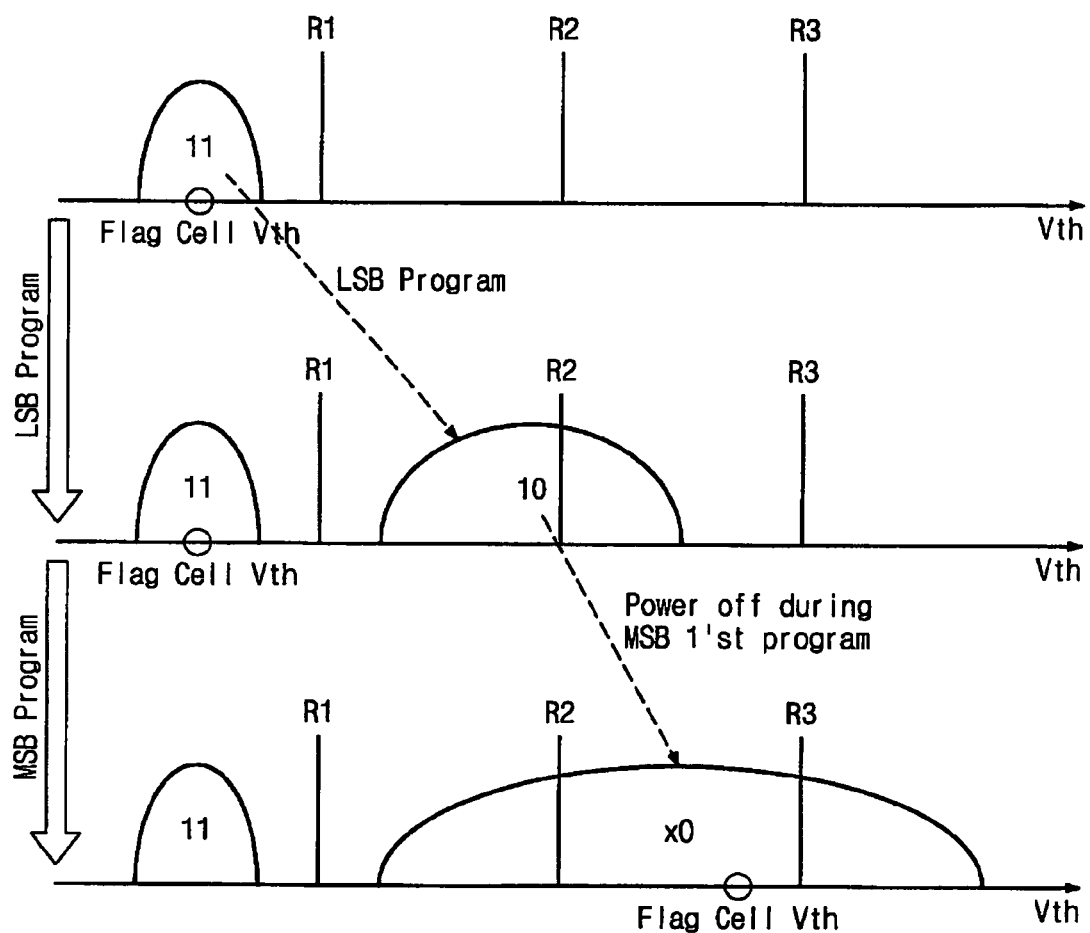
FIG. 5 illustrates a case wherein a flag cell is disturbed when power is turned OFF during a MSB program operation.
Figure 6:
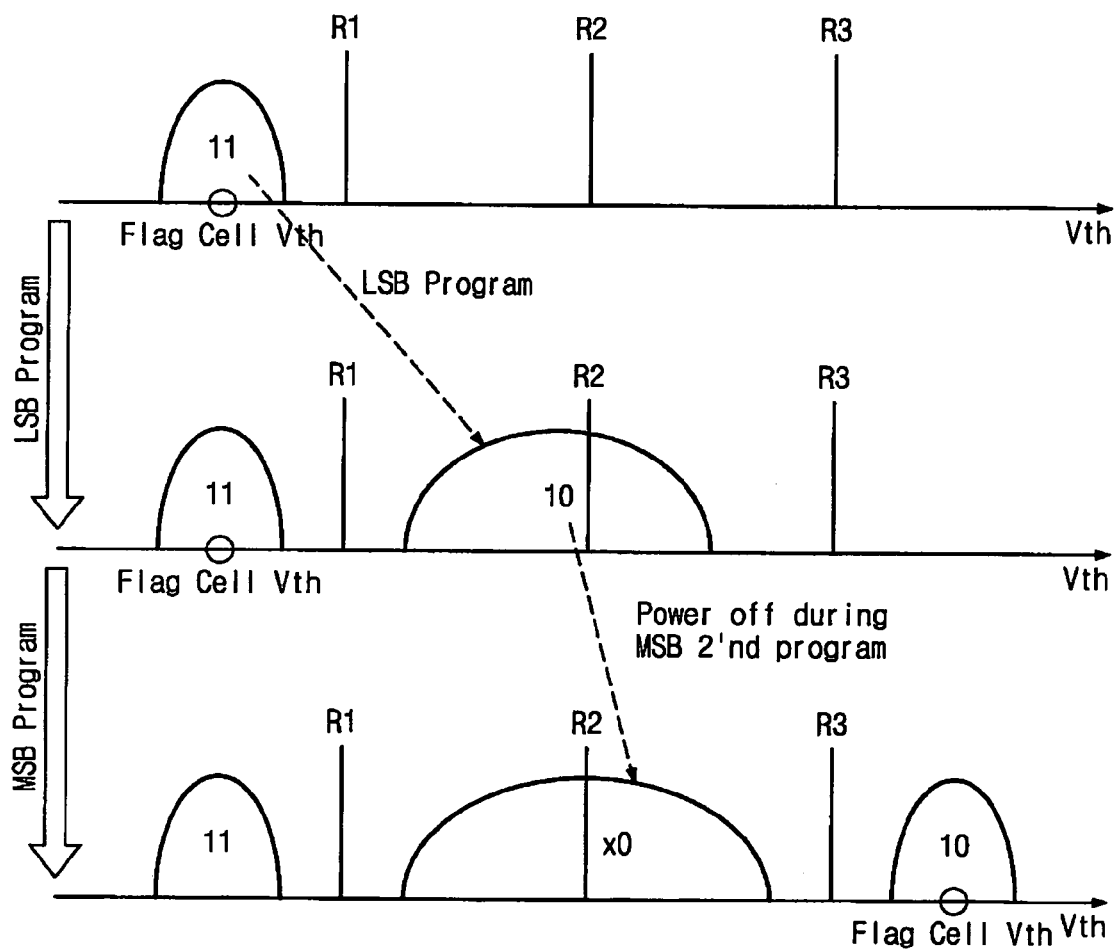
FIG. 6 illustrates another case wherein a flag cell is disturbed when power is turned OFF during a MSB program operation.

First of all, there will be described how LSB read error described in FIG. 4 is overcome. Referring to FIG. 4, a threshold voltage of a flag cell is distributed within a threshold voltage distribution corresponding to data '10' and is greater than a second read voltage R2. It is assumed that a selected memory cell has data '10' and that its threshold voltage is greater than the first read voltage R1 but less than the second read voltage R2.

In accordance with this assumption, during the main LSB read operation performed by read state machine 120, an erroneous determination may be made regarding a memory cell storing data '1' due to a disturbed flag cell threshold voltage. Error detect module 130 detects this situation and generates an error signal. The error signal enables LSB recover-read state machine 140 to control memory core 110 to perform the LSB recover-read operation with respect to the memory cell. The LSB recover-read operation may be made with respect to the memory cell using the first read voltage R1 as a word line voltage applied to a selected page/word line. At this time, since a threshold voltage of the selected memory cell is greater than the first read voltage R1, during the LSB recover-read operation, data '0' may be read from the selected memory cell. Thus, the errant LSB data may be recovered via the LSB recover-read operation implemented in accordance with an embodiment of the invention. That is, it is possible to prevent LSB read errors caused by a disturbed flag cell threshold voltage during a LSB program operation. It is also possible to overcome LSB read errors described in relation to FIGS. 5 and 6 using a LSB read method according to an embodiment of the invention.

Non-volatile memory device 100 and a corresponding LSB read method according to an embodiment of the invention are capable of recovering erroneously read LSB data. In particular, non-volatile memory device 100 and the LSB read method are capable of preventing LSB data from being erroneously read from memory cells due to a disturbed flag cell threshold voltage.

As set forth above, non-volatile memory device 100 according to an embodiment of the invention may include error detect module 130. But, error detect module 130 may be variously implemented using hardware, software, and/or firmware, and may be implemented as part of a memory controller operatively connected to non-volatile memory device 100.

Figure 10:
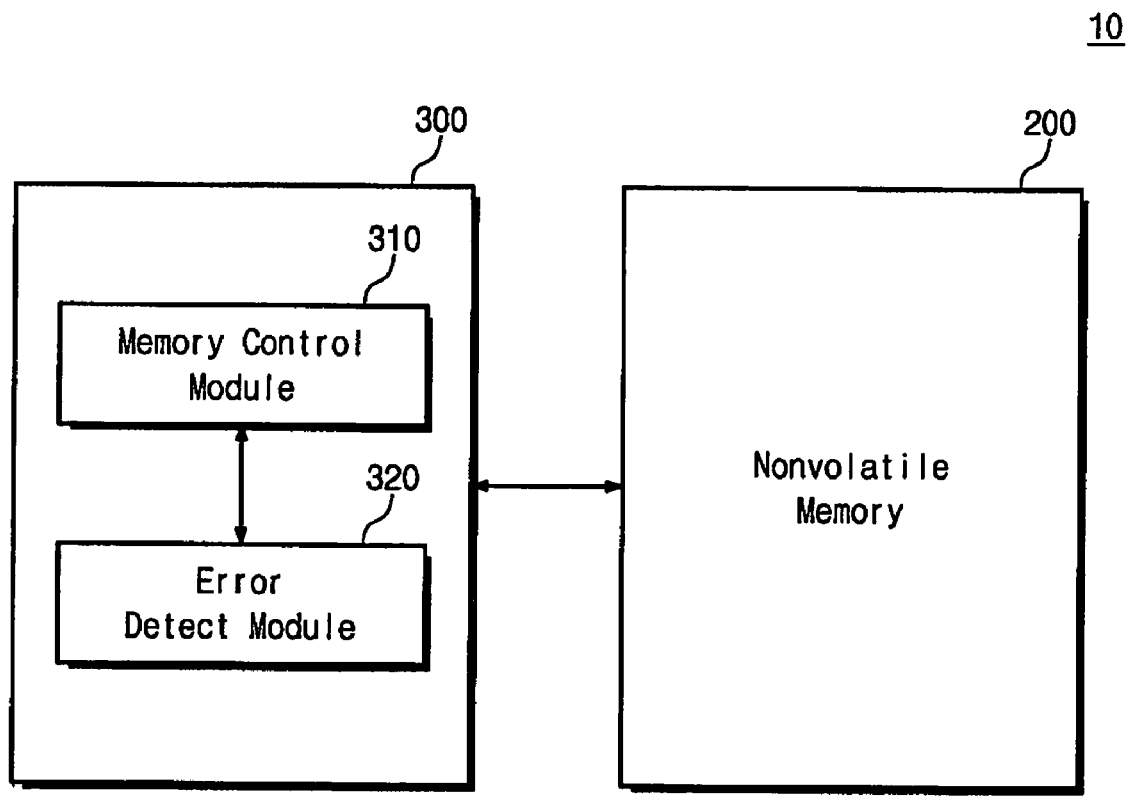
FIG. 10 is a block diagram showing a memory system according to an embodiment of the invention.

FIG. 10 is a block diagram illustrating a memory system according to an embodiment of the invention.

Referring to FIG. 10, a memory system 10 comprises a non-volatile memory device 200 and a memory controller 300. Non-volatile memory device 200 may include a memory cell array comprising multi-bit memory cells. Non-volatile memory device 200 may be configured to perform LSB and MSB program operations in relation to the memory cells. Non-volatile memory device 200 may be configured to perform a plurality of LSB read operations in order to read LSB data from the memory cells. As set forth above, the plurality of LSB read operations may include a main LSB read operation and an LSB recover-read operation, where the LSB recover-read operation is performed only when errant data is read from the memory cells during the main LSB read operation. For this, the non-volatile memory device according to the present invention may include an LSB recover-read state machine, a read state machine, and a memory core such those described in relation to FIG. 7.

Memory controller 300 may be configured to control the overall operation of non-volatile memory device 200. Memory controller 300 may include a memory control module 310 and an error detect module 320.

Memory control module 310 may produce commands and addresses required to perform the various program operations and/or read operations directed to memory cells in non-volatile memory device 200. Further, data to be programmed may be sent to non-volatile memory device 200 under the control of memory control module 310.

Error detect module 320 may be configured to detect error (s) in the data read from non-volatile memory device 200. In particular, when data read from memory cells during a main LSB read operation is erroneous, error detect module 320 may generate an error signal that is to be sent to memory control module 310. At this time, memory control module 310 may respond to the error signal and control non-volatile memory device 200 so as to read LSB data from memory cells via an LSB recover-read operation different from the main LSB read operation.

For example, memory controller 300 may control a read state machine of non-volatile memory device 200 so as to read LSB data from memory cells using a flag cell threshold voltage. If the LSB data is erroneous, error detect module 320 may send the error signal to memory control module 310 which controls an LSB recover-read state machine in non-volatile memory device 200 to read the LSB data from the memory cells without using the potentially disturbed flag cell threshold voltage.

As understood from the above description, memory system 10 may include functionality for recovering erroneously read LSB data. For example, although a disturbed flag cell threshold voltage may exist when the LSB data is erroneously read from the memory cells, memory system 10 according to an embodiment of the invention is capable of recovering the LSB data.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the present invention is to be determined by the broadest permissible interpretation of the following claims and their equivalents.

What is claimed is:

1. A Least Significant Bit (LSB) read method for a non-volatile memory device comprising multi-level memory cells, the method comprising:
    reading LSB data from a memory cell during a main LSB read operation making reference to a flag cell threshold voltage;
    determining whether the LSB data contains an error; and
    if the LSB data contains an error re-reading the LSB data during a LSB recover-read operation without making reference to the flag cell threshold voltage.

2. The LSB read method of claim 1, wherein the main LSB read operation comprises determining with reference to the flag cell threshold voltage whether the memory cell is LSB programmed or MSB programmed.

3. The LSB read method of claim 1, further comprising:
    determining whether the LSB data read during the LSB recover-read operation contains an error.

4. The LSB read method of claim 2, wherein the memory cell is a 2-bit memory cell capable of storing data values of '11', '10', '00', and '01' programmed according to an ascending order of corresponding threshold voltage distributions.

5. The LSB read method of claim 4, wherein the flag cell is programmed to a data value of '11' during a LSB program operation and to a data value of '01' during a MSB program operation.

6. The LSB read method of claim 5, wherein the reading LSB data during the main LSB read operation comprises:
- determining whether the flag cell threshold voltage is greater than a second read voltage; and
- if the flag cell threshold voltage is less than the second read voltage, determining whether the threshold voltage of the memory cell is greater than a first read voltage; but
- if the flag cell threshold voltage is greater than the second read voltage, determining whether the threshold voltage of the memory cell is greater than the second read voltage,
- wherein the first read voltage is between the respective threshold voltage distributions corresponding to data values of '11' and '01', and the second read voltage is between the respective threshold voltage distributions for corresponding to data values '01' and '00'.

7. The LSB read method of claim 6, wherein re-reading the LSB data during the LSB recover-read operation comprises determining whether the threshold voltage of the memory cell is greater than the first read voltage.

8. A non-volatile memory device comprising:
- a memory core comprising a memory cell capable of being programmed by a LSB program operation and a MSB program operation;
- a read state machine configured to control the memory core to perform the LSB read operation or the MSB read operation in relation to an externally applied input read command and corresponding address and with reference to a flag cell threshold voltage;
- an error detect module configured to detect whether LSB data read from the memory cell during a main LSB read operation contain an error and generating an error signal upon detecting the error; and
- an LSB recover-read state machine responsive to the error signal and configured to control the memory core to perform a LSB recover-read operation operating without reference to the flag cell threshold voltage.

9. The non-volatile memory device of claim 8, wherein the flag cell threshold voltage indicates during the main LSB read operation whether the memory cell is LSB programmed or MSB programmed.

10. The non-volatile memory device of claim 9, wherein the memory cell is a 2-bit memory cell capable of storing data values of '11', '10', '00', and '01' programmed according to an ascending order of corresponding threshold voltage distributions.

11. The non-volatile memory device of claim 9, wherein the flag cell is programmed to a data value of '11' during a LSB program operation and to a data value of '01' during a MSB program operation.

12. The non-volatile memory device of claim 11, wherein the read state machine controls performance of the main LSB read operation by:
- determining whether the flag cell threshold voltage is greater than a second read voltage; and
- if the flag cell threshold voltage is less than the second read voltage, determining whether the threshold voltage of the memory cell is greater than a first read voltage; but
- if the flag cell threshold voltage is greater than the second read voltage, determining whether the threshold voltage of the memory cell is greater than the second read voltage,
- wherein the first read voltage is between the respective threshold voltage distributions corresponding to data values of '11' and '01', and the second read voltage is between the respective threshold voltage distributions for corresponding to data values '01' and '00'.

13. The non-volatile memory device of claim 12, wherein the LSB recover-read state machine controls performance of the LSB recover-read operation by determining whether the threshold voltage of the memory cell is greater than the first read voltage.

14. A memory system comprising:
- a non-volatile memory device controlled by a memory controller,
- wherein the non-volatile memory device comprises a memory core comprising a memory cell capable of being programmed by a LSB program operation and a MSB program operation; and
- the operative combination of the non-volatile memory device and the memory controller implement;
- a read state machine configured to control the memory core to perform the LSB read operation or the MSB read operation in relation to an externally applied input read command and corresponding address and with reference to a flag cell threshold voltage;
- an error detect module configured to detect whether LSB data read from the memory cell during a main LSB read operation contain an error and generating an error signal upon detecting the error; and
- an LSB recover-read state machine responsive to the error signal and configured to control the memory core to perform a LSB recover-read operation operating without reference to the flag cell threshold voltage.

15. The memory system of claim 14, wherein the memory controller comprises the error detect module.

16. The memory system of claim 15, wherein the non-volatile memory device comprises the read state machine and the LSB recover-read state machine.

17. The memory system of claim 16, wherein the flag cell threshold voltage indicates during the main LSB read operation whether the memory cell is LSB programmed or MSB programmed.

18. The memory system of claim 17, wherein the memory cell is a 2-bit memory cell capable of storing data values of '11', '10', '00', and '01' programmed according to an ascending order of corresponding threshold voltage distributions.

19. The memory system of claim 18, wherein the flag cell is programmed to a data value of '11' during a LSB program operation and to a data value of '01' during a MSB program operation.

20. The memory system of claim 19, wherein the read state machine controls performance of the main LSB read operation by:
- determining whether the flag cell threshold voltage is greater than a second read voltage; and
- if the flag cell threshold voltage is less than the second read voltage, determining whether the threshold voltage of the memory cell is greater than a first read voltage; but
- if the flag cell threshold voltage is greater than the second read voltage, determining whether the threshold voltage of the memory cell is greater than the second read voltage,
- wherein the first read voltage is between the respective threshold voltage distributions corresponding to data values of '11' and '01', and the second read voltage is between the respective threshold voltage distributions for corresponding to data values '01' and '00'.

* * * * *